(12) United States Patent
Phillips

(10) Patent No.: US 8,619,234 B2
(45) Date of Patent: Dec. 31, 2013

(54) UTILITIES TRANSFER SYSTEM IN A LITHOGRAPHY SYSTEM

(75) Inventor: Alton Hugh Phillips, E. Palo Alto, CA (US)

(73) Assignee: Nikon Corporation, Tokyo (JP)

(*) Notice: Subject to any disclaimer, the term of this patent is extended or adjusted under 35 U.S.C. 154(b) by 148 days.

(21) Appl. No.: 11/473,967

(22) Filed: Jun. 23, 2006

(65) Prior Publication Data

US 2006/0250595 A1 Nov. 9, 2006

Related U.S. Application Data

(62) Division of application No. 10/734,396, filed on Dec. 12, 2003, now abandoned.

(51) Int. Cl.
G03B 27/58 (2006.01)
G03B 27/62 (2006.01)
G03B 27/42 (2006.01)

(52) U.S. Cl.
USPC .................... 355/72; 355/53; 355/75

(58) Field of Classification Search
USPC .............. 355/53, 72–75; 310/10, 12, 370, 310/216.023, 15, 27, 12.05, 12.06, 12.01, 310/20, 23, 24, 49.06, 49.02, 49.19, 17, 310/12.12; 336/115, 117–119, 120, 129, 336/130–136; 318/830
See application file for complete search history.

(56) References Cited

U.S. PATENT DOCUMENTS

| 3,594,672 | A | * | 7/1971 | Frenkel | 336/132 |
| 4,149,133 | A | * | 4/1979 | Hilgert | 336/30 |
| 4,321,572 | A | * | 3/1982 | Studer et al. | 336/83 |
| 4,654,571 | A | * | 3/1987 | Hinds | 318/687 |
| 4,754,180 | A | * | 6/1988 | Kiedrowski | 310/90.5 |
| 4,808,958 | A | * | 2/1989 | Hewitt et al. | 336/136 |
| 4,916,340 | A | * | 4/1990 | Negishi | 310/12.13 |
| 5,528,118 | A | | 6/1996 | Lee | |
| 5,668,672 | A | | 9/1997 | Oomura | |

(Continued)

FOREIGN PATENT DOCUMENTS

| EP | 0469744 A1 | 2/1992 |
| EP | 1018669 A2 | 7/2000 |

(Continued)

OTHER PUBLICATIONS

PCT application No. PCT/US2004/041112, Invitation to Pay Additional Fees, partial international search report, mailed Nov. 25, 2005.
PCT application No. PCT/US2004/041112, International Search Report, mailed Feb. 15, 2006.
PCT application No. PCT/US2004/041112, Written Opinion mailed Feb. 15, 2006.

(Continued)

*Primary Examiner* — Toan Ton
*Assistant Examiner* — Christina Riddle
(74) *Attorney, Agent, or Firm* — Weaver Austin Villeneuve & Sampson

(57) ABSTRACT

Techniques for transferring utilities to and from a reticle or wafer stage in a lithography system while minimizing physical disturbances that affect the stage are described. These techniques involve transferring utilities to and from the stage without making physical contact with the stage. Alternatively, utilities are transferred by making physical contact with the stage while the stage is in a stationary position. In addition to transferring utilities to and from the stage, devices such as processing devices, buffers (storage mediums), electrical components, and mechanical components can be placed within the stage to use and/or control the transferred utilities.

6 Claims, 10 Drawing Sheets

(56) References Cited

U.S. PATENT DOCUMENTS

| | | | |
|---|---|---|---|
| 5,689,377 | A | 11/1997 | Takahashi |
| 5,804,959 | A * | 9/1998 | Nakagawa et al. ........... 323/355 |
| 5,835,275 | A | 11/1998 | Takahashi et al. |
| 5,841,250 | A | 11/1998 | Korenge et al. |
| 5,847,518 | A * | 12/1998 | Ishiwaki ........................ 315/276 |
| 5,874,820 | A | 2/1999 | Lee |
| 5,887,430 | A * | 3/1999 | Hirai et al. ...................... 60/433 |
| 5,949,681 | A * | 9/1999 | Asai et al. ...................... 700/113 |
| 6,032,546 | A | 3/2000 | Stone |
| 6,094,255 | A * | 7/2000 | Ota ................................. 355/75 |
| 6,128,069 | A * | 10/2000 | Korenaga ......................... 355/53 |
| 6,590,633 | B1 * | 7/2003 | Nishi et al. ...................... 355/53 |
| 6,740,891 | B2 | 5/2004 | Driessen et al. |
| 6,770,890 | B2 * | 8/2004 | Tanaka ..................... 250/442.11 |
| 6,891,599 | B2 | 5/2005 | Iwamoto |
| 6,911,747 | B2 * | 6/2005 | Tsuboi et al. ............... 310/12.05 |
| 7,119,877 | B2 * | 10/2006 | Takita ............................. 355/53 |
| 7,375,797 | B2 | 5/2008 | Phillips |
| 2002/0079464 | A1 | 6/2002 | Driessen et al. |
| 2002/0093252 | A1 | 7/2002 | Kang et al. |
| 2003/0098961 | A1 | 5/2003 | Iwamoto |
| 2003/0142281 | A1 * | 7/2003 | Nishi ............................... 355/53 |
| 2003/0164934 | A1 | 9/2003 | Nishi et al. |
| 2004/0004703 | A1 * | 1/2004 | Hazelton ......................... 355/72 |
| 2004/0007922 | A1 | 1/2004 | Kang et al. |
| 2005/0128449 | A1 | 6/2005 | Phillips |
| 2006/0261679 | A1 | 11/2006 | Phillips |
| 2007/0069666 | A1 * | 3/2007 | Van Eijk et al. .............. 318/135 |

FOREIGN PATENT DOCUMENTS

| | | |
|---|---|---|
| EP | 1286221 A2 | 2/2003 |
| JP | 09284907 A * | 10/1997 |
| JP | 11-214482 A | 6/1999 |
| JP | 11-214482 | 8/1999 |
| JP | 2001-258272 | 9/2001 |
| WO | WO2005/062130 | 7/2005 |

OTHER PUBLICATIONS

PCT application No. PCT/US2004/041112, International Preliminary Report on Patentability, mailed Jun. 22, 2006.
US Office Action (Jun. 12, 2007) from U.S. Appl. No. 11/473,966.
US Notice of Allowance (Jan. 31, 2008) from U.S. Appl. No. 11/473,966.
US Notice of Allowance dated Mar. 15, 2006 from U.S. Appl. No. 10/734,396.
US Restriction Requirement dated Dec. 29, 2005 from U.S. Appl. No. 10/734,396.
US Restriction Requirement dated Oct. 28, 2005 from U.S. Appl. No. 10/734,396.
US Restriction Requirement dated Mar. 12, 2007 from U.S. Appl. No. 11/473,966.
Korean Notice of Grounds of Rejection dated Apr. 1, 2011, issued in Korean Application No. 2006-7011582.
Chinese Office Action dated Oct. 10, 2008, issued in Application No. 200480036514.7.
Chinese Office Action dated Nov. 26, 2010, issued in Application No. 201010156656.4.
European Communication Under Article 94 issued Feb. 10, 2011, from Application No. 04 813 434.0.
European Communication Under Rule 112 issued Feb. 12, 2007, from Application No. 04 813 434.0.
Singapore Invitation to Respond to Written Opinion issued Sep. 4, 2008, from Application No. 200603430-0.
Singapore Search and Examination Report issued Jun. 25, 2009, from Application No. 200603430-0.
Japanese Office Action for Patent Application No. 2006-543953. Dated May 20, 2010.
Japanese Office Action for Patent Application No. 2006-543953. Dated Dec. 6, 2010.
Japanese Decision of Rejection for Patent Application No. 2006-543953. Dated Sep. 2, 2011.
Japanese Decision of Dismissal for Patent Application No. 2006-543953. Dated Sep. 2, 2011.

* cited by examiner

UTILITIES TRANSFER SYSTEM IN A LITHOGRAPHY SYSTEM

RELATED APPLICATION DATA

This application is a divisional application of U.S. application Ser. No. 10/734,396, filed Dec. 12, 2003 now abandoned, by Alton Hugh Phillips and entitled, "Utilities Transfer System In A Lithography System", now pending, the content of which is hereby incorporated by reference herein for all purposes.

FIELD OF THE INVENTION

The present invention relates generally to lithography systems, and more specifically to techniques for minimizing physical disturbances and contamination of wafer or reticle stages when transferring utilities to such stages.

BACKGROUND OF THE INVENTION

Lithography systems are used to manufacture semiconductor devices by exposing semiconductor wafers to specific patterns of light. This is typically done by shining light, through a patterned reticle, onto the wafers. A reticle is supported within a reticle stage, which is in turn supported by a frame. The reticle stage is supported in a way that it can be precisely moved with respect to the frame and thereby with respect to the wafer. The reticle stage can be supported through mechanical devices such as actuators or through resistance-free techniques that employ air pressure or electromagnetic forces. In some lithography systems, a wafer stage, which supports a wafer, can also be precisely moved with respect to a supporting frame.

The reticle or wafer stages require one or more utilities, such as electrical power, electrical control signals, fluids (e.g., for cooling purposes), and gases (e.g., to function as a conductor) to function. Such utilities are usually transferred to and from a stage through flexible cables and hoses. Usually, the utilities are transferred between the stage and the supporting frame. Unfortunately, typical problems with such transfer techniques include vibration transmission between the stage and the frame, particle generation by the connecting hoses and cables, and leaks by the hoses and cables. Vibration transmission occurs because the cables and hoses provide a vibration path between the stage and the frame. This causes a reduction in stage positioning performance. Also, cables and hoses can be caused to vibrate if a natural mode of the cables and hoses is excited either by the stage motion or by the base motion. Particle generation is problematic because moving cables and hoses can generate particles as they bend, flex, and rub on fixed surfaces. These particles can reduce performance of lithographic processes if they should migrate to the reticle, optics, wafer, or metrology devices. Finally, leakage is always a risk since flexible hoses can break.

The solutions to reduce risk of such problems have led to stiff, bulky, or high bend-radius cables and hoses, which consume space or worsen vibration transmission. Other solutions to reduce these risks include limiting coolant material to one, which is less effective than water, but evaporates quickly and is non-corrosive to system components.

These problems are especially problematic with Next Generation Lithography (NGL) systems, which require extremely high tolerances. One type of NGL system is an Extreme Ultraviolet (EUV) system, which operates in a vacuum and utilizes specially coated mirror optics. Reticles in EUV systems are supported on one side of a chuck, which is attached to the reticle stage, so that light from the light source can be reflected off of the reticle. In addition to the already discussed problems, EUV systems have additional problems that are associated with flexible cables and hoses. For one, out gassing of water and hydrocarbons from the flexible hoses can have adverse affects on the life of optical elements. For example, water can corrode optical elements and such damage is irreparable. Also, hydrocarbons reduce optical reflectivity over time, which will reduce system throughput. Out gassing also adversely affects the time to reach operating vacuum levels. The possible solution of baking-out cables and hoses only makes them stiffer which in turn exacerbates certain problems.

In view of the foregoing, techniques for transferring utilities to a reticle or wafer stage without accompanying physical disturbances or contaminating particles or gases would be desirable.

BRIEF SUMMARY OF THE INVENTION

The present invention is directed to techniques for transferring utilities to and from a reticle or wafer stage in a lithography system while minimizing physical disturbances that affect the stage. These techniques involve transferring utilities to and from the stage without making physical contact with the stage. Alternatively, utilities are transferred by making physical contact with the stage while the stage is in a stationary position.

One aspect of the invention pertains to a lithography system having a transformer, a stage, and a frame. The transformer includes an inductive core, a primary inductive coil, and a secondary inductive coil, wherein the inductive core has a first and a second end and wherein the primary inductive coil is wrapped around the first end of the inductive core. The stage is suitable for supporting a wafer or a reticle wherein the stage houses the secondary inductive coil, and the frame supports the stage and the inductive core such that the second end of the inductive core extends into the secondary inductive coil, wherein each side surface of the inductive core maintains a minimum distance of separation from an inner surface of the secondary inductive coil, whereby electrical power supplied to the primary inductive coil can be drawn by the secondary inductive coil.

Another aspect of the invention pertains to a lithography system having a stage suitable for supporting a wafer or a reticle, a frame that supports the stage, a stage utility transfer means for transferring utilities between the stage and the frame, the stage utility transfer means being located within or on a surface of the stage, and a frame utility transfer means for transferring utilities between the stage and the frame, the frame utility transfer means being located within or on a surface of the frame, whereby the stage and the frame can remain physically separated from each other while utilities are transferred between the stage and the frame.

Another aspect of the invention pertains to a method for transferring utilities between a stage and a base of a lithography system. The method includes connecting a supply channel between the frame and the stage, transferring utilities between the stage and the frame through the connected supply channel, and disconnecting the supply channel from the stage. A particular implementation of the method further includes stabilizing the stage from a scanning motion to a stationary position before connecting the supply channel, and then causing the stage to resume a scanning motion after disconnecting the supply channel.

Another aspect of the invention pertains to a lithography system having a transformer that includes at least a primary inductive coil, a secondary inductive coil, a stage, and a frame. The secondary inductive coil has a first end and a second end wherein the first and second ends are at opposite ends of a lengthwise axis of the secondary inductive coil. The stage is suitable for supporting a wafer or a reticle wherein the stage is attached to at least the first end of the secondary coil and thereby supports the secondary inductive coil. The frame supports the primary coil such that the primary coil is proximate to the secondary coil wherein the primary coil and the secondary coil maintain a separation distance from each other when the stage moves relative to the frame along the lengthwise axis of the secondary coil. An electrical current within the primary coil creates an electromagnetic field that causes electrical current to flow within the secondary inductive coil.

Yet another aspect of the invention pertains to a lithography system having a stage suitable for supporting a reticle or wafer, a stage port located on a surface of the stage, a frame for supporting the stage, a frame port located on a surface of the frame wherein the stage port and the frame port are suitable for making a connection with each other so that gas and/or fluids can be transferred between the stage and the frame, and a frame vacuum pump within the frame, the frame vacuum pump having vacuum passageways that extend to the surface of the frame at positions around a perimeter of the frame port, whereby the frame vacuum pump can evacuate any gas and/or fluids that leak from the connection between the stage port and the frame port.

These and other features and advantages of the present invention will be presented in more detail in the following specification of the invention and the accompanying figures, which illustrate by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE INVENTION

The present invention will now be described in detail with reference to a few preferred embodiments as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known operations have not been described in detail so not to unnecessarily obscure the present invention.

The present invention pertains to techniques for transferring utilities to and from a stage in a lithography system while minimizing physical disturbances that affect the stage. The stages are those that support a reticle or a semiconductor wafer. These techniques allow the high tolerances for positioning the stage with respect to critical components of the lithography system to be satisfied. The techniques also satisfy the stringent requirements for maintaining a contaminant-free processing environment. These techniques involve transferring utilities to and from the stage without making physical contact with the stage. Alternatively, utilities are transferred by making physical contact with the stage while the stage is in a stationary position. In addition to transferring utilities to and from the stage, devices such as processing devices, buffers (storage mediums), electrical components, and mechanical components can be placed within the stage to use and/or control the transferred utilities.

Figure 1:
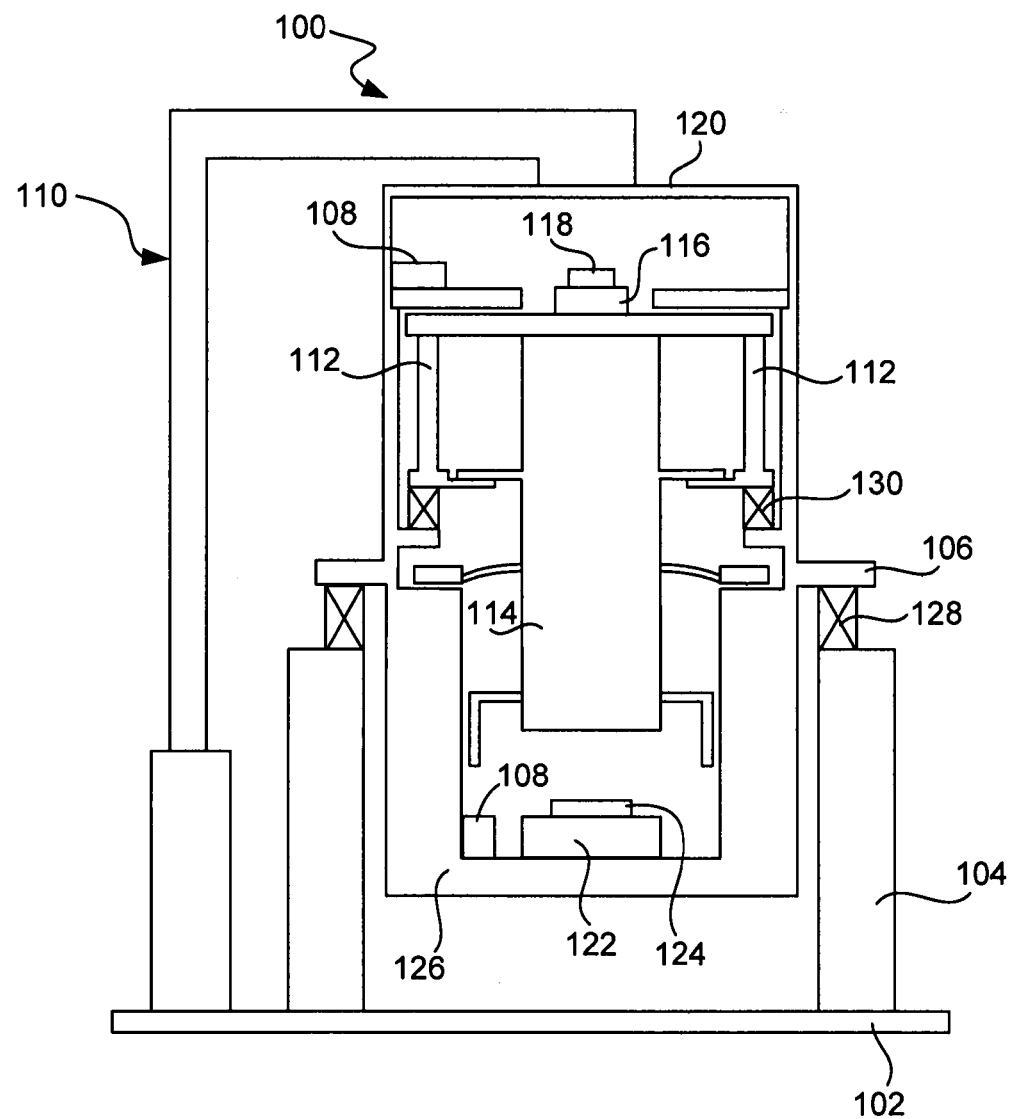
FIG. 1 illustrates an overview of the common components of a lithography system.

FIG. 1 illustrates an overview of the common components of a lithography system 100. The following section describes these components; however note that the pertinent components of system 100 relative to the present invention are reticle stage 116, reticle 118, and optical frame 112. Reticle stage 116, which supports reticle 118, is supported by and moves in controlled motions with respect to optical frame 112. As reticle stage 116 moves, light from above or below reticle 118 can be used to illuminate a specific pattern upon selected areas of wafer 124. The devices relating to the transfer of utilities between stage 116 and optical frame 112 will be described in detail following the description of these common components. Note that although reticle stage 116 is shown to be positioned above optical frame 112, other lithography systems position the reticle stage within a supporting frame (see FIGS. 2 and 5).

Although the present discussion will focus on utilities transfer between reticle stage 116 and optical frame 112, the concepts of the present invention apply equally to utilities transfer between a wafer stage and its supporting structure. For example, the utilities transfer techniques of the present invention can be implemented upon wafer stage 122 and lower enclosure 126. The concepts relating to buffering and processing devices within reticle stage 116 also can be implemented within wafer stage 122.

Lithography system 100 includes a mounting base 102, a support frame 104, a base frame 106, a measurement system 108, a control system (not shown), an illumination system 110, an optical frame 112, an optical device 114, a reticle stage 116 for retaining a reticle 118, an upper enclosure 120 surrounding reticle stage 116, a wafer stage 122 for retaining a semiconductor wafer 124, and a lower enclosure 126 surrounding wafer stage 122.

Support frame 104 typically supports base frame 106 above mounting base 102 through a base vibration isolation system 128. Base frame 106 in turn supports, through an optical vibration isolation system 130, optical frame 112, measurement system 108, reticle stage 116, upper enclosure 120, optical device 114, wafer stage 122, and lower enclosure 126 above base frame 106. Optical frame 112 in turn supports optical device 114, reticle stage 116, and reticle 118 above base frame 106 through optical vibration isolation system 130. As a result thereof, optical frame 112 and its supported components and base frame 106 are effectively attached in series through base vibration isolation system 128 and optical vibration isolation system 130 to mounting base 102. Vibration isolation systems 128 and 130 are designed to damp and isolate vibrations between components of lithography system 100. Seals may be placed between base frame 106 (the upper enclosure 120) and the lens assembly 114. Such a sealing arrangement provides a good seal for the enclosure 120, yet helps prevent the transmission of vibrations between the enclosure and the lens assembly 114. Measurement system 108 monitors the positions of stages 116 and 122 relative to a reference such as optical device 114 and outputs position data to the control system.

Optical device 114 typically includes a lens assembly that projects and/or focuses the light or beam from an illumination system 110 that passes through reticle 118. In other embodiments of apparatus 100, illumination system 110 and optical device 114 is set up to project and/or focus light such that it reflects off of reticle 118.

Reticle stage 116 is set upon optical frame 112 so that reticle stage 116 can move through controlled movements (e.g., scanning motions) with respect to optical frame 112 and wafer 124. Reticle stage 116 can be set upon guides that help guide the movement of reticle stage 116. Or, reticle stage 116 could be a guideless type stage that uses no guides. Exemplary guides include air bearings, ball bearings, electromagnetic bearings (Lorentz force, Maxwell force), or permanent magnets. Reticle stage 116 can be moved in the desired motions by movers. Movers can be various types of actuators such as piezoelectric actuators, electromagnetic actuators (Lorentz force, Maxwell force), pneumatic actuators, and ball and screw actuators among others.

Similarly, wafer stage 122 can be set upon lower enclosure 126 and guided through controlled movements with or without guides as described from reticle stage 116. Also wafer stage 122 can be moved with similar movers as described for reticle stage 116.

When magnetic levitation is used, reticle stage 116 could be driven by an electromagnetic planar motor. Such a motor could have a magnet unit with two-dimensionally arranged magnets and an armature coil unit having two-dimensionally arranged coils in facing positions. With this type of driving system, either one of the magnet unit or the armature coil unit is connected to the stage and the other unit is mounted on the moving plane side of the stage.

Movement of reticle stage 116 and wafer stage 122 as described above generates reaction forces, which can affect performance of the photolithography system. Reaction forces generated by wafer (substrate) stage 122 motion can be mechanically released to the floor (ground) by use of a frame member as described in U.S. Pat. No. 5,528,118 and published Japanese Patent Application Disclosure No. 8-166475. Additionally, reaction forces generated by reticle (mask) stage 116 motion can be mechanically released to the floor (ground) by use of a frame member as described in U.S. Pat. No. 5,874,820 and published Japanese Patent Application Disclosure No. 8-330224. The disclosures in U.S. Pat. Nos. 5,528,118 and 5,874,820 and Japanese Patent Application Disclosure No. 8-330224 are incorporated herein by reference.

As will be appreciated by those skilled in the art, there are a number of different types of photolithographic devices. For example, lithography system 100 can be used as a scanning type photolithography system, which exposes the pattern from reticle 118 onto wafer 124 with reticle 118 and wafer 124 moving synchronously. In a scanning type lithographic device, reticle 118 is moved perpendicular to an optical axis of lens assembly 114 by reticle stage 116 and wafer 124 is moved perpendicular to an optical axis of lens assembly 114 by wafer stage 122. Scanning of reticle 118 and wafer 124 occurs while reticle 118 and wafer 124 are moving synchronously.

Alternately, lithography system 100 can be a step-and-repeat type photolithography system that exposes reticle 118 while reticle 118 and wafer 124 are stationary. In the step and repeat process, wafer 124 is in a constant position relative to reticle 118 and lens assembly 114 during the exposure of an individual field. Subsequently, between consecutive exposure steps, wafer 124 is consecutively moved by wafer stage 122 perpendicular to the optical axis of lens assembly 114 so that the next field of semiconductor wafer 124 is brought into position relative to lens assembly 114 and reticle 118 for exposure, Following this process, the images on reticle 118 are sequentially exposed onto the fields of wafer 124 so that the next field of semiconductor wafer 124 is brought into position relative to lens assembly 114 and reticle 118.

However, the use of lithography system 100 provided herein is not limited to a photolithography system for a semiconductor manufacturing. Lithography system 100, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of a lens assembly. Additionally, the present invention provided herein can be used in other devices, including other semiconductor processing equipment, machine tools, metal cutting machines, and inspection machines.

The illumination source (of illumination system 110) can be g-line (436 nm), i-line (365 nm), KrF excimer laser (248 nm), ArF excimer laser (193 nm) and $F_2$ laser (157 nm). Alternatively, the illumination source can also use charged particle beams such as x-ray and electron beam. For instance, in the case where an electron beam is used, thermionic emission type lanthanum hexaboride ($LaB_6$,) or tantalum (Ta) can be used as an electron gun. Furthermore, in the case where an electron beam is used, the structure could be such that either a mask is used or a pattern can be directly formed on a substrate without the use of a mask.

With respect to lens assembly 114, when far ultra-violet rays such as the excimer laser are used, glass materials such as quartz and fluorite that transmit far ultra-violet rays is preferably used. When the $F_2$ type laser or x-ray is used, lens assembly 114 should preferably be either catadioptric or refractive (a reticle should also preferably be a reflective type), and when an electron beam is used, electron optics should preferably comprise electron lenses and deflectors. The optical path for the electron beams should be in a vacuum.

Also, with an exposure device that employs vacuum ultraviolet radiation (VUV) of wavelength 200 nm or lower, use of the catadioptric type optical system can be considered. Examples of the catadioptric type of optical system include the disclosure Japan Patent Application Disclosure No. 8-171054 published in the Official Gazette for Laid-Open Patent Applications and its counterpart U.S. Pat. No. 5,668,672, as well as Japan Patent Application Disclosure No. 10-20195 and its counterpart U.S. Pat. No. 5,835,275. In these cases, the reflecting optical device can be a catadioptric optical system incorporating a beam splitter and concave mirror. Japan Patent Application Disclosure No. 8-334695 published in the Official Gazette for Laid-Open Patent Applications and its counterpart U.S. Pat. No. 5,689,377 as well as Japan Patent Application Disclosure No. 10-3039 also use a reflecting-refracting type of optical system incorporating a concave mirror, etc., but without a beam splitter, and can also be employed with this invention. The disclosures in the above mentioned U.S. patents, as well as the Japan patent applications published in the Official Gazette for Laid-Open Patent Applications are incorporated herein by reference.

The present invention can also be implemented when lithography system 100 is an extreme ultraviolet lithography (EUVL) system. In EUVL systems, illumination source 110 generates light at extremely small wavelengths. For example, light of wavelengths in the range of approximately 13 nm that is produced by laser produced plasma (LPP) or gas discharged plasma (GDP) can be used. Optical components of EUVL systems typically use reflective optics with special multilayer coatings of silicon and molybdenum since refractive optics absorb an excessive amount of the EUV radiation. Also, since most gases absorb EUV radiation, the EUV beam path is typically contained within a vacuum environment.

As described above, a photolithography system according to the above-described embodiments can be built by assembling various subsystems, including each element listed in the appended claims, in such a manner that prescribed mechanical accuracy, electrical accuracy and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, total adjustment is performed to make sure that every accuracy is maintained in the complete photolithography system. Additionally, it is desirable to manufacture an exposure system in a clean room where the temperature and humidity are controlled.

Now that the common components of a lithography system have been described, FIGS. 2, 3, 4A and 4B, 5A and 5B, and 6 will describe the techniques for transferring utilities that do not require physical contact between a stage and its supporting structure or any type of utility supply device. These techniques are referred to as the non-contact techniques for transferring utilities. Then FIGS. 7 and 8 will describe the techniques that involve physical contact between a stage and its supporting structure or any type of utility supply device, referred to as the contact techniques.

Figure 2:
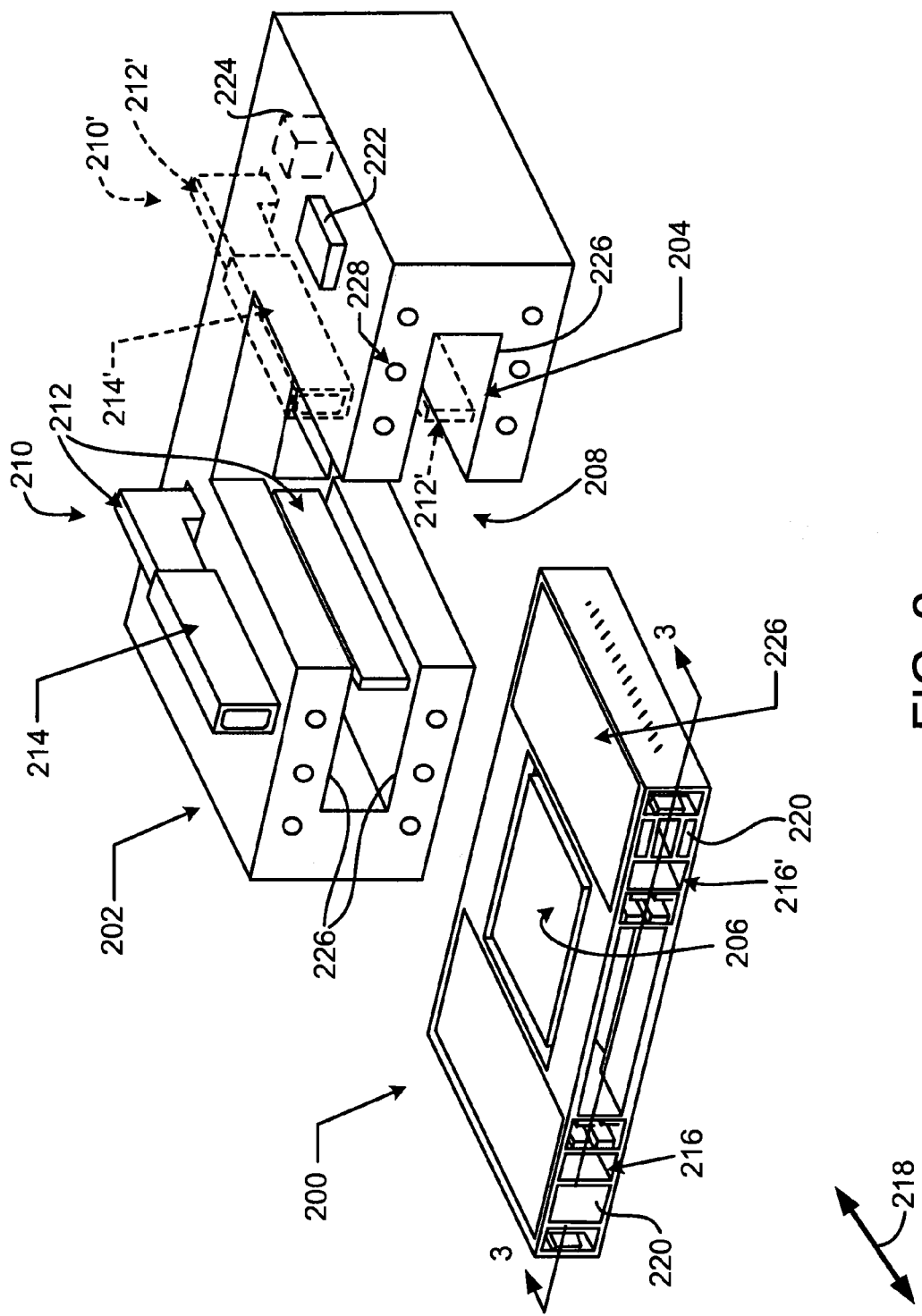
FIG. 2 illustrates a perspective, cross-sectional view of a reticle stage, its supporting frame, and the devices for non-contact transfer of utilities according to one embodiment of the present invention.
Figure 3:
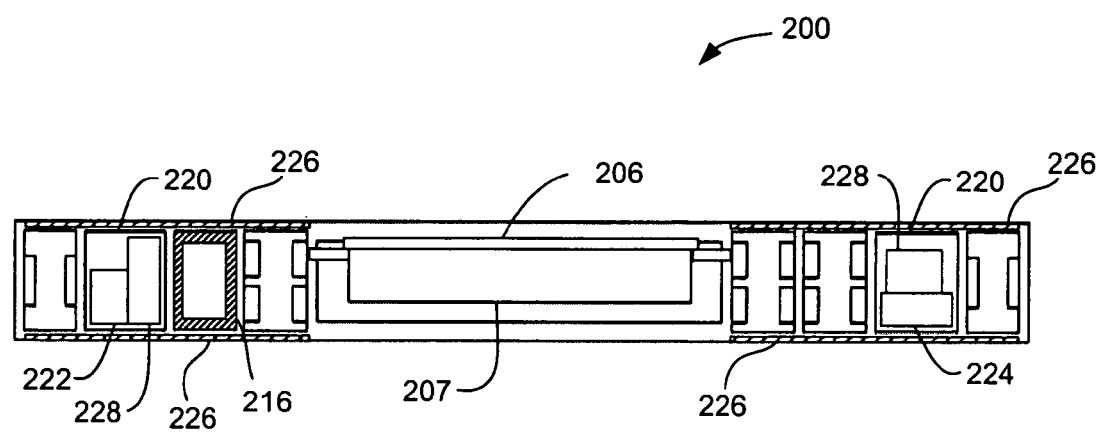
FIG. 3 illustrates a side, cross-sectional view of the stage of FIG. 2 along line 3-3.

FIG. 2 illustrates a perspective, cross-sectional view of a reticle stage 200, its supporting frame 202, and the devices for non-contact transfer of utilities according to one embodiment of the present invention. The rest of the components of a lithography system are not represented in FIG. 2 to more clearly represent the aspects of the present invention. FIG. 3 illustrates a side, cross-sectional view of stage 200 of FIG. 2 along line 3-3. Non-contact utilities transfer refers to utilities transfer where there is substantially zero stiffness between stage 200 and frame 202 and the transfer devices apply substantially zero net force on the stage (i.e. applies no disturbing net force to the stage). Such transfer can occur while stage 200 is moving with respect to frame 202, for example while stage 200 is scanning. The utilities can also be transferred while stage 200 is stationary, for example in between wafer processing steps.

The cross-section of frame 202 of FIG. 2 is taken approximately at a mid-point such that one-half of frame 202 is shown. The cross-section of stage 200 is taken near one end of stage 200. In assembled form, stage 200 would freely slide into slot 204 and be completely enclosed by frame 202. Stage 200 is similar to a picture that is set within a picture frame. As discussed earlier, techniques using electromagnets or air pressure can be used to suspend and control the movement of stage 200 within slot 204 of frame 202. Stage 200 supports a reticle 206, which is accessible to a light source through opening 208 of frame 202. FIG. 3 shows electronics compartments 220 that provide room for buffer devices, processing devices, sensors, and other types of devices.

FIG. 2 is meant to show the typical structure of stage 200 and frame 202 and to serve as a backdrop for describing the techniques for transferring utilities between the two structures. Therefore, it should be understood that the transfer techniques of the present invention can also be implemented in stages and frames having different configurations and methods of use. For example, stage 200 can support a reticle 206 that is meant to transmit light or reflect light onto a semiconductor wafer. The embodiment shown in FIGS. 2 and 3 is suitable for light to reflect off of reticle 206 where reticle 206 is supported with a separate support structure referred to as a chuck 207. Such a chuck 207, as shown in FIG. 3, can be independently oriented with respect to stage 200 through the use of actuators, drivers, sensors, etc.

One of the utilities that needs to be delivered to stage 200 is electrical power. A transformer is one non-contact device used to transfer power through electrical induction. A transformer 210 is shown in FIG. 2 to extend into frame 202, within slot 204, and along the outside surface of frame 202. Transformer 210 includes an inductive core 212, an inductive primary coil 214, and a inductive secondary coil 216. Primary coil 214 is wrapped around the portion of inductive core 212 that is outside of stage 200 and frame 202. Secondary coil 216 is housed within stage 200. As is commonly understood, a current through primary coil 214 creates an electromagnetic field that is directed by inductive core 212 so that the electromagnetic field causes current to flow within secondary coil 216. In other words, power is supplied to primary coil 214 so that inductive secondary coil 216 can draw power through inductive core 212. Inductive secondary coil 216 is secured within stage 200 such that the portion of inductive core 212 within slot 204 inserts into inductive secondary coil 216 when stage 200 is inserted into slot 204. The portion of inductive core 212 within slot 204 is positioned so that inductive secondary coil 216 can freely move over inductive core 212 while stage 200 moves along a scanning axis 218 during scanning processes. To ensure contact-free, relative motion between inductive core 212 and secondary coil 216, the inner diameter of secondary coil 216 should be larger than the largest diameter of inductive core 212. As shown in FIG. 2, the longitudinal axis of the portion of inductive core 212 within slot 204 is substantially parallel to the longitudinal axis of secondary coil 216.

The configuration of transformer 210 allows power to be drawn from secondary coil 216 without any physical contact between secondary coil 216 and inductive core 212. Physical contact between stage 200 and frame 202 is also avoided when stage 200 is supported through air levitation or electromagnetic levitation techniques. With non-contact stage levitation and power transmission techniques, power can be supplied to a moving or stationary stage 200 while minimizing physical disturbance forces to stage 200. Additionally, contaminants from power cables that could be used to supply power to stage 200 are also avoided.

In alternative embodiments, multiple inductive secondary coils can be arranged to loop over inductive core 212 within stage 200. By having more than one inductive secondary coil, stage 200 can draw power at different voltage levels from each of the inductive secondary coils. In yet other embodiments, multiple transformers can be positioned at various locations of stage 200 and frame 202. Accordingly, stage 200 would have multiple inductive secondary coils to receive an end of the inductive core for each of the transformers, e.g., optional inductive secondary coils 216' shown in FIG. 2. For example, a transformer (e.g., optional transformer 210', which includes optional inductive core 212' and optional inductive primary coil 214') can be placed on each side of stage 200. Smaller transformers can be used in this manner so that power at different voltages can be drawn from each transformer.

Figure 4A:
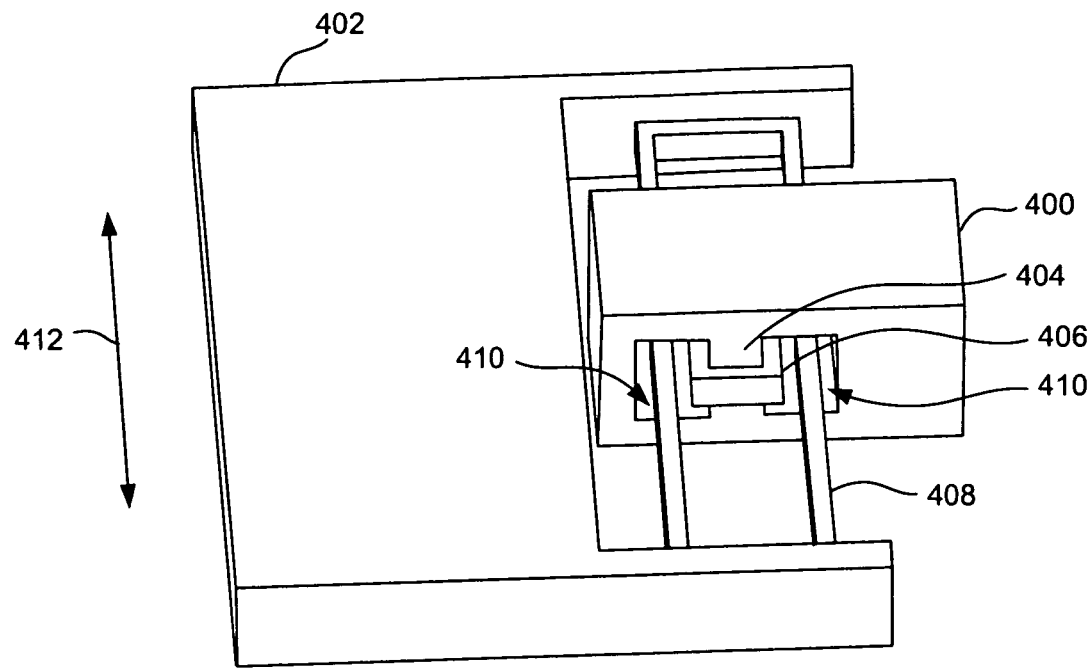
FIG. 4A illustrates a perspective view of a frame and a stage that utilize an alternative embodiment of a transformer for non-contact transfer of electrical power between the frame and the stage.
Figure 4B:
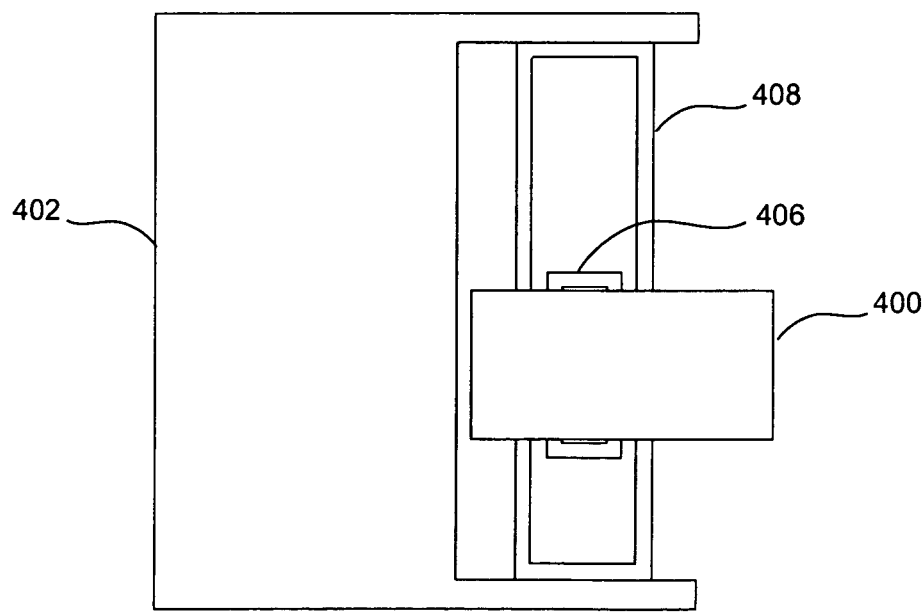
FIG. 4B illustrates a top-plan view of the frame and the stage of FIG. 4A.

FIG. 4A illustrates a perspective view of a frame 400 and a stage 402 that utilize an alternative embodiment of a transformer for non-contact transfer of electrical power between frame 400 and stage 402. FIG. 4B illustrates a top-plan view of frame 400 and stage 402 of FIG. 4A. Note that only the portion of frame 400 that is necessary to describe the use of the transformer is illustrated in FIGS. 4A and 4B. This embodiment of the transformer includes an inductive core 404 that is built into frame 400, an inductive primary coil 406, and an inductive secondary coil 408. Frame 400 has two openings 410 that are separated by inductive core 404. Primary coil 406 is wrapped around inductive core 404. Secondary coil 408 is looped such that it has a larger diameter and encompasses inductive core 404 and primary coil 406. Secondary coil 408 is supported at its ends by stage 402. Secondary coil 408 also passes through each of openings 410 of frame 400 in close proximity to primary coil 406. Secondary coil 408 does not make contact with primary coil 406 or core 404 so that stage 402 and secondary coil 408 can freely move with respect to frame 400 during a scanning motion of stage 402. Stage 402 can move back and forth along scanning axis 412 such that the longitudinal axis of secondary coil 408 passes through openings 410. The length of secondary coil 408 can be adjusted depending upon the length of the stroke desired for the transformer.

In an alternative embodiment, the transformer can function without a core. In other words, a primary and a secondary coil will more relative to each other without the presence of a core. For example, primary coil 406 could be suspended within frame 400 that does not have an inductive core 404. Coreless inductive power transfer devices can also be used, however such devices tend to be less efficient than transformers using iron cores and there is a higher risk of generating disturbance forces.

The configuration of the transformer of FIGS. 4A and 4B can also be implemented in an opposite fashion as shown. In other words, in an alternative embodiment, what is described above as frame 400 and its associated components could be the stage. Also, what is described as stage 402 and its associated components could be the frame. The stage would then include a coil that is wrapped around a core, and the frame would then support the longer coil that extends through the stage.

Figure 5A:
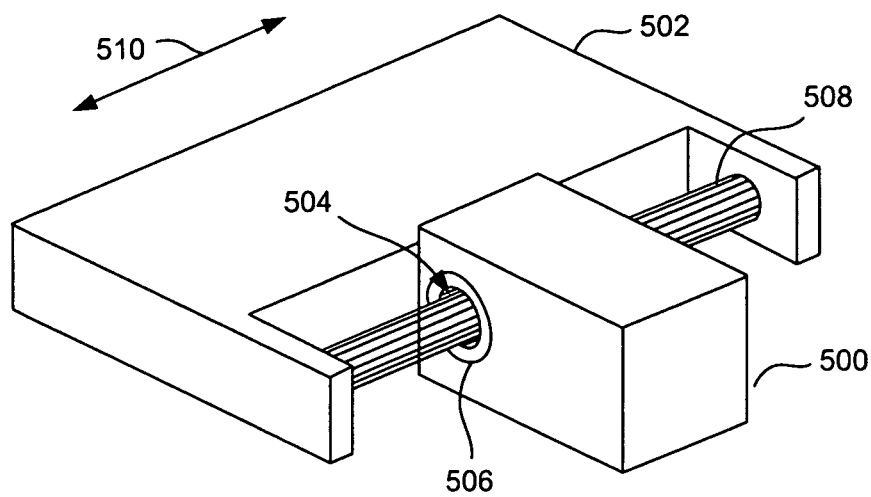
FIG. 5A illustrates a perspective view of a frame and a stage that utilize yet another alternative embodiment of a transformer for non-contact transfer of electrical power between the frame and the stage.
Figure 5B:
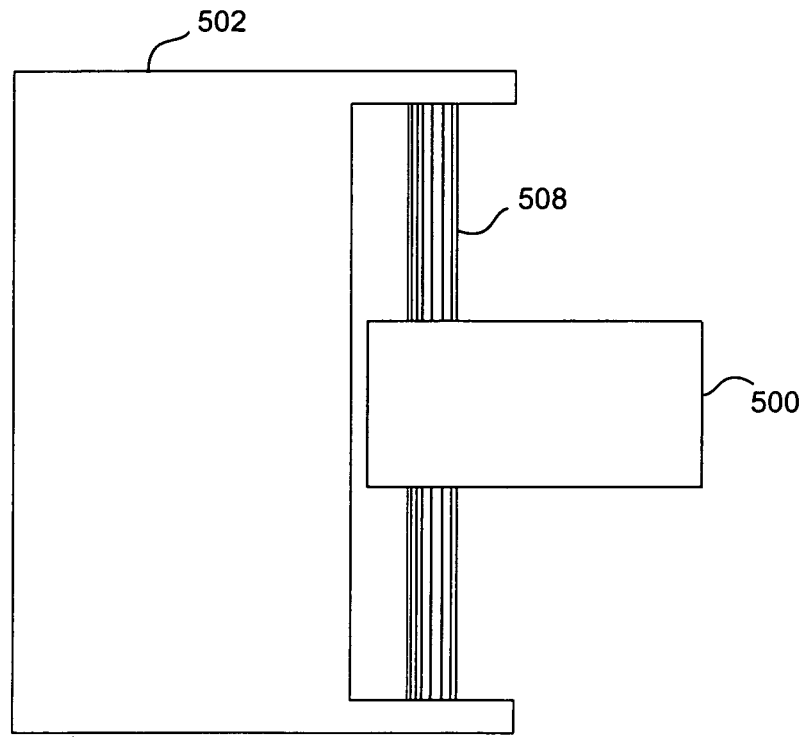
FIG. 5B illustrates a top-plan view of the frame and the stage of FIG. 5A.

FIG. 5A illustrates a perspective view of a frame 500 and a stage 502 that utilize yet another alternative embodiment of a transformer for non-contact transfer of electrical power between frame 500 and stage 502. FIG. 5B illustrates a top-plan view of frame 500 and stage 502 of FIG. 5A. As with FIGS. 4A and 4B, note that only the portion of frame 500 that is necessary to describe the use of the transformer is illustrated in FIGS. 5A and 5B. Frame 500 has a passageway 504 wherein the inner surface of passageway 504 is lined with a primary coil 506. Stage 502 supports a secondary coil 508 that is rod-shaped. In other words, secondary coil 508 is a solenoid. Solenoid 508 passes through passageway 504. Note that the transformer does not utilize a core. However, in an alternative embodiment, an inductive core could be inserted down the center of solenoid 508.

Passageway 504 is sized larger than the diameter of solenoid 508 so that solenoid 508 can pass through passageway 504 without physical contact. In this way, stage 502 can move back and forth along the axis of solenoid 508 in a non-contact manner while power is supplied to stage 502. Scanning axis 510 shows the direction in which stage 502 moves with respect to frame 500.

The configuration of the transformer of FIGS. 5A and 5B can also be implemented in an opposite fashion as shown. In other words, in an alternative embodiment, what is described above as frame 500 and its associated components could be the stage. Also, what is described as stage 502 and its associated components could be the frame. The stage would then include a passageway that is lined with an inductive coil, and the frame would then support the solenoid that passes through the passageway of the stage.

Other non-contact techniques for transferring power between stage 200 and frame 202 include the use of radio frequency transmission, radiation transmission, and electrical arcing.

In addition to transferring power to stage 200, it is also useful to buffer or store the transferred power within stage 200. Buffering refers to the temporary storage of a utility by the stage in order to enable efficient transfer of the utility or to make the utility more suited to specific needs or limitations of various stage subsystems. Electrical power can be buffered by various devices such as rechargeable batteries, capacitors, and ultra-capacitors. Of the three options, ultra-capacitors can be charged faster than conventional rechargeable batteries and have more capacity than conventional capacitors. Ultra-capacitors also have higher specific power than conventional batteries and higher specific energy than conventional capacitors. Ultra-capacitors also have slower degradation rates than conventional rechargeable batteries. These buffering devices can be placed within electronics compartments 220 of stage 200.

Another utility to transfer between stage 200 and frame 202 are electrical signals. Electrical signals can carry the instructions and data for the various processors installed within stage 200. Such processors can control amplifiers, drivers, actuators, and sensors also installed within stage 200. Memory devices for storing electrical signals can also be placed within stage 200. Electrical signals can be transmitted in various ranges of the electromagnetic spectrum but are typically transmitted through radio frequency (RF) signals or through optical signals (e.g., infrared signals).

Radio frequency transceivers, transmitters, and receivers, which are represented by boxes 222, can be placed within electronics compartments 220 of stage 200 and in various positions in or on frame 202. The communication components 222 in each of stage 200 and frame 202 should be positioned such that a clear communication channel between stage 200 and frame 202 is maintained during the scanning motion of the stage. That is, the transceivers should be positioned such that radio frequency interference is avoided.

Optical signal transceivers, transmitters, and receivers, which are represented by boxes 224, can also be placed within electronics compartments 220 and in various positions within or one frame 202. Optical signal transmission is advantageous because signals can be transmitted over high-bandwidth channels.

Optical communications components 224 can be placed such that the optical signals travel between the optical components 224 on stage 200 and frame 202 in a direction that is parallel to scanning axis 218. In this way, optical communication can be maintained throughout the scanning motion range of stage 200. For example, the optical component 224 in stage 200 is placed in the electronics compartment 200 on the right-hand side, as seen in FIG. 3, and an optical component 224 is placed at the far surface of frame 202, as seen in FIG. 2 such that the optical components in stage 200 and frame 202 align with each other. In alternative embodiments, optical components 224 can be placed such that the transmitted optical signals do not travel in a direction parallel to scanning axis 218. In such a configuration, direct communication between stage 200 and frame 202 is possible when stage 200 is stationary or only when stage 200 and frame 202 come into correct relative positioning for optical components 224 to match up during a scanning process.

During a lithography operation, heat is generated at stage 200 and needs to be removed for various reasons. One reason is that heat can cause slippage of contact between a stage or chuck and a reticle due to differences in material thermal expansion coefficients. Heat transfer techniques can take advantage of convection, conduction, and/or radiation. Convection, which involves heat transfer in a gas or fluid by the circulation of currents from one region to another, is effective in non-vacuum environments. Conduction, which involves heat transfer through a gas in a gap too small to allow the generation of convection currents is possible in low vacuum and is most effective in non-vacuum environments.

Heat can also be transferred through radiation, which involves the emission and propagation of energy in the form of rays or waves. Radiation heat transfer techniques are applicable in either vacuum or non-vacuum environments.

Heat transfer surfaces 226 on each of stage 200 and frame 202 can take advantage of thermal conduction and/or radiation. Heat transfer surfaces 226 on stage 200 can serve as heat sinks that collect heat from heat sources in stage 200. Heat is channeled to surfaces 226 that function as heat sinks by conduction through high specific conductive materials such as graphite foam. Thermosyphons can also be used. As generally known, thermosyphons can be heat pipes depending on relative elevation of evaporators and condensers and if there are acceleration forces, which can hinder return fluid flow. Thermosyphons are advantageous since they are lightweight and have very high equivalent specific conductivity. This allows for a large amount of heat transfer in lightweight structures over small temperature gradients. By maintaining the heat transfer surfaces 226 on frame 202 at a lower temperature than that of the heat transfer surfaces 226 on stage 200, heat collected at heat transfer surfaces 226 on stage 200 can be drawn into heat transfer surfaces 226 within frame 202.

One or more heat transfer surfaces 200 can be placed on stage 200 and frame 202 and they can have different sizes and shapes depending upon the specific requirements of a lithography system.

Heat transfer surfaces 226 can be on one or more surfaces of stage 200. For example, heat transfer surfaces 226 can be on the top, bottom, and/or the side surfaces of stage 200. Corresponding heat transfer surfaces 226 on frame 202 should match up to each other when stage 200 is installed within frame 202.

Removing heat from stage 200 is more effective when the overall temperature of frame 202 is maintained a temperature that is lower than that of stage 200. Various techniques can be used to maintain frame 202 at a certain temperature. One technique for maintaining a low temperature of frame 202, which is represented in FIG. 2, uses cooling channels 228 that run throughout the body of frame 202. Cooling channels 228 allow coolant, e.g., water, to run remove heat from frame 202.

If the temperature of reticle stage 200 changes significantly, the stage materials will expand and/or contract, which can distort reticle 200 and reticle chuck 207 and reduce stage performance. To avoid this problem, the stage structural material can be made of a low thermal expansion material such as Zerodur™ (made by Schott Lithotec). This will make stage 200 less sensitive to internal temperature changes.

Some lithography systems require the exchange of gas and/or fluids between a reticle and/or wafer stage for various purposes. Non-contact techniques for transferring gas and fluids can utilize phase change properties of materials. Also fluids can be directly deposited onto a stage from a frame.

Figure 6:
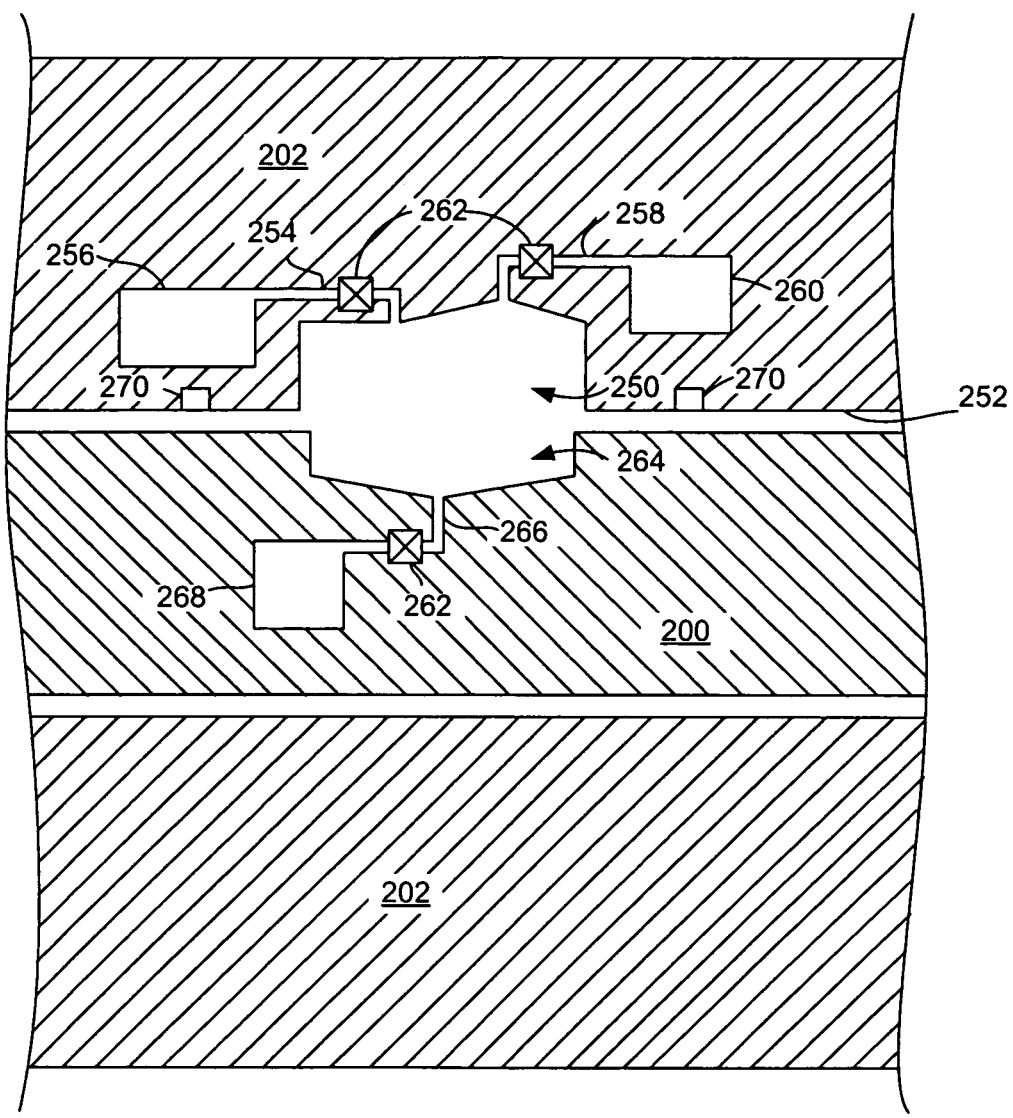
FIG. 6 illustrates an enlarged, cross-sectional view of a stage and a frame where non-contact transfer of gas and fluids can occur.

One technique for transferring gas without involving physical contact between stage 200 and frame 202 involves an inverted cavity within the upper half of frame 202. FIG. 6 illustrates an enlarged, cross-sectional view of stage 200 and frame 202 where non-contact transfer of gas and fluids can occur. The upper half of frame 202 includes an inverted cavity 250 on its bottom surface 252. Cavity 250 also has a supply passageway 254 that leads to a reservoir or pressure vessel 256 and a collection passageway 258 that leads to another reservoir or pressure vessel 260. Valves 262 control the flow of gas or fluids through passageways 254 and 258. Stage 200 includes a well 264, a passageway 266 that leads to a reservoir or pressure vessel 268, and a valve 262 that controls the flow of gas or fluid through passageway 266. In some embodiments of the invention, a single passageway and reservoir that can both expel and collect gases and fluids in frame 202 is sufficient. In an alternative embodiment, the inverted cavity can be formed in a bottom surface of stage 200 and a well can be formed in the top surface of the lower half of frame 202. In yet another embodiment, a inverted cavity and well combination is located in both the top and bottom surfaces of stage 200.

One technique for transferring gas or fluid from stage 200 to frame 202 involves releasing gas from reservoir 268 through passageway 266 such that it is captured by inverted cavity 250. Then collection passageway 258 sucks the gas into reservoir 260. After the gas is collected, the gas can be cooled so that it changes into liquid form if needed. In the embodiment shown in FIG. 6, the diameter of inverted cavity 250 is larger than the diameter of well 264 such that the opening of inverted cavity 250 completely encompasses the opening of well 264. In some embodiments, the opening of inverted cavity 250 is large enough to completely encompass well 264 throughout the range of motion that stage 200 travels during a scanning process. In such an embodiment, inverted cavity 250 is able to collect substantially all of the gas released by reservoir 268. Vacuum devices 270 can be positioned around the perimeter of inverted cavity 250 of frame 202 in order to evacuate any gases that are not collected by inverted cavity 250. In alternative embodiments, vacuum devices can also be positioned on the top surface of stage 200 at positions surrounding inverted cavity 250.

In alternative embodiments, stage 200 does not actually include well 264. In such embodiments, gas is released at the top surface of stage 200 directly through the opening of passageway 266. In turn, inverted cavity 250 can have a smaller diameter than that shown in FIG. 6, wherein the diameter of inverted cavity 250 is approximately the same size or slightly larger than the diameter of passageway 266.

This technique of releasing gas from reservoir 268 is effective when stage 200 and frame 202 operate in non-vacuum conditions. However, this technique can be used in vacuum conditions when a low-pressure gas is transferred.

A fluid can be transferred from stage 200 to frame 202 through evaporation techniques. This involves releasing fluid from reservoir 268 into well 264. Then a heating element heats the fluid in well 264 so that it evaporates and is captured in inverted cavity 250. At that point, collection passageway 258 can suck the gaseous form of the fluid into reservoir 260. Again, gaseous form of the fluid can be converted back to fluid form if desired. In one embodiment, the heat used to evaporate fluid in well 264 can come from the heat generated by the reticle stage or the wafer stage due to normal operating conditions. Such heat can be channeled towards well 264 through heat conductive materials or heat pipes. Alternatively, well 264 can be placed adjacent to a heat sink in stage 200. In other embodiments, no heating is required to cause the fluid in well 264 to evaporate.

Fluid can be transferred from frame 202 to stage 200 using various techniques. One technique takes advantage of the condensation of gases. This involves maintaining the temperature of stage 200 or well 264 at a temperature that is sufficiently low such that a gaseous form of the fluid to be transferred condenses in well 264. To implement this technique, a gaseous form of the fluid is released from reservoir 256 through passageway 254. Then the gas will condense on the surface of well 264, which is maintained at a sufficiently low temperature. The condensed fluid can then be collected through passageway 266 and into reservoir 268. The bottom surface of well 264 is sloped downwards toward the opening of passageway 266 to facilitate the collection of the condense fluid.

Another technique for transferring fluid from frame 202 to stage 200 involves pouring the fluid from passageway 254 of frame 202 into well 264. It should be appreciated that various devices can be used to expel and collect gases and or liquids at each of inverted cavity 250 and well 264. Also, the depth of inverted cavity 250 and well 264 can vary from very shallow to relatively deep.

Contact techniques for transferring utilities between a stage and a frame can also allow a lithography system to satisfy the positioning tolerances for the stage and to maintain a substantially contaminant-free processing environment. Contact utilities transfer involves utilities transfer where there is more than zero stiffness between the base and stage and the transfer devices apply a substantially non-zero net force on the stage. To satisfy the tolerances and cleanliness requirements of lithography systems, contact techniques for transferring utilities are performed when a stage is stationary with respect to the supporting structure (the frame). For example, utilities transfer can occur with the reticle stage during wafer exchange and wafer alignment. When a reticle or wafer stage comes to a stationary position, physical connections between a transfer device on a frame are made with a transfer device on the stage. Then after the transfer of utilities is completed and the physical connections are disconnected, the stage can begin its scanning motions again. In some embodiments, the transferred utilities are stored or buffered by the stage so that they can be used during wafer scanning process.

Figure 7:
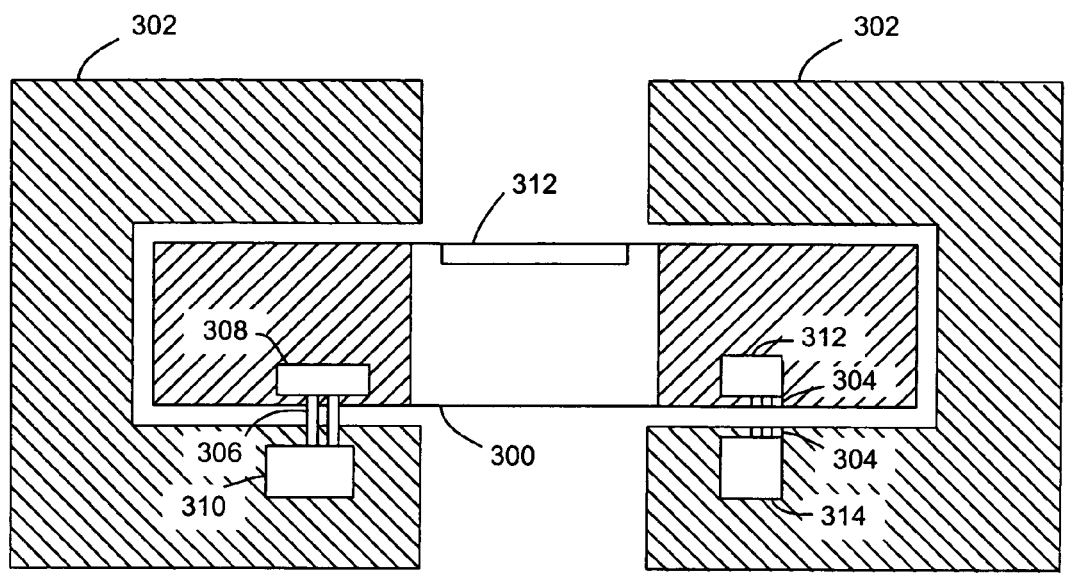
FIG. 7 illustrates a side, cross-sectional view of a stage and a frame that transfers utilities through contact techniques according to one embodiment of the present invention.

FIG. 7 illustrates a side, cross-sectional view of a stage 300 and a frame 302 that transfers utilities through contact techniques according to one embodiment of the present invention. Reticle 312 is supported by stage 300.

Electrical power and electrical signals are transferred between a stage and a frame through electrical conductors. These conductors can take on various forms, such as cables, wires, or electrodes. The conductors terminate with a terminator, for example a contact pad, so that terminators on a stage can mate with a terminator on a frame. The conductors can make contact with each other when the stage comes to a stationary position with respect to a frame. For instance, conductors 304 in stage 300 and frame 302 will come into contact with each other when stage 300 become stationary and is lowered onto frame 302. Upon contact, conductors 304 connect power source 314 within frame 302 and power buffer device 312 within stage 300.

In an alternative embodiment, conductors 304 can make contact with each other without lowering stage 300 onto frame 302 by having conductors 304 extend out from either stage 300 or frame 302 or both. Such extending conductors can be metal prongs, cables, or wires that are designed to extend from either stage 300 or frame 302.

The electrical power and electrical signals can be buffered using the same techniques described earlier with respect to non-contact power and signal transfer.

Heat transfer in contact transfer techniques can utilize mass, fluid, and gas exchange and conduction. In exchange techniques, a mass or an object, fluid, and/or gas is transferred between stage 300 and frame 302 when stage 300 is stationary.

Fluids and gases are transferred between a stage and a frame to be used as a coolant to remove heat from stages. Fluids and gases are injected into cooling channels within stage 300. The fluid (or gas) then collects heat as it is circulated around stage 300. When the fluid (or gas) collects a certain amount of heat, it is then removed from stage 300, and then replaced with another injection of low temperature fluid (or gas). The fluids or gases can also be utilized for fluid or gas films that separate, for example, a reticle and the chuck that supports the reticle. The fluid or gas films facilitate heat transfer away from the reticle and into the chuck, stage, or heat sinks.

Fluid and gas coolants can be transferred through hoses 306 when stage 300 is stationary. In essence, heat is transferred intermittently from stage 300. This is implemented by connecting hoses 306 to stage 300 when it is stationary, and then disconnecting the hoses before the stage begins its scanning motions. Specifically, hoses 306 provide a path for gas or fluid to travel between a cooling system 308 within stage 300 and a reservoir 310 within frame 302. Hoses 306 can extend from frame 302 to connect with stage 300, or hoses 306 can extend from stage 300 to connect with frame 302. Various mechanical devices, such as actuators can be used to extend hoses 306.

Figure 8:
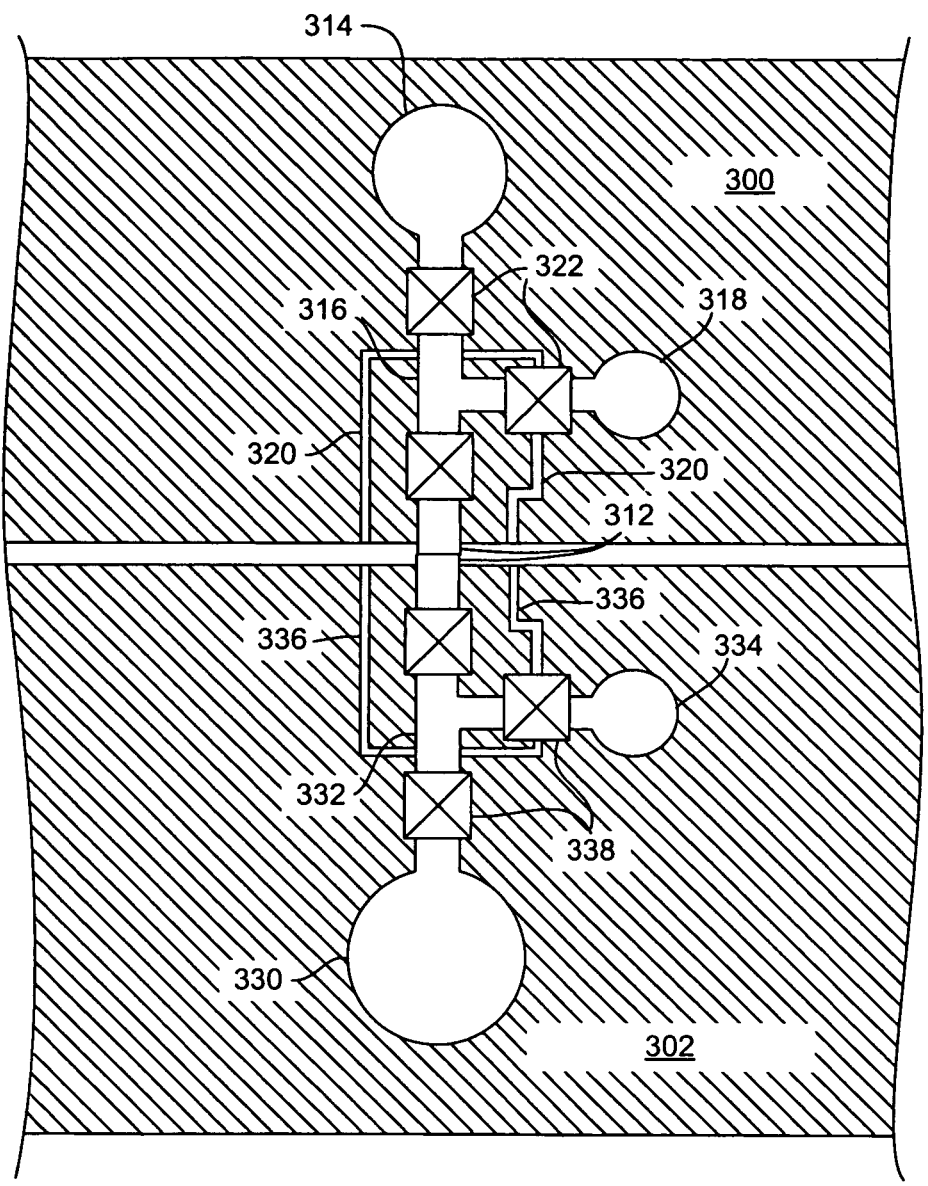
FIG. 8 illustrates an enlarged view of the interface between a stage and a frame according to an alternative embodiment of the invention wherein ports make contact with each other in order to transfer gases and/or fluids.

An alternative to hoses for transferring fluids and gases are fixed ports on each of stage 300 and frame 302. FIG. 8 illustrates an enlarged view of the interface between stage 300 and frame 302 according to an alternative embodiment of the invention wherein ports 312 make contact with each other in order to transfer gases and/or fluids. Ports 312 come into contact with each other when stage 300 is lowered onto the lower supporting surface of frame 302. Stage 300 includes a reservoir or pressure vessel 314, a passageway 316 that leads from reservoir 314 to port 312. A vacuum pump 318 is connected to passageway 316 and has vacuum pipes 320 that lead to the surface of stage 300 at points around the perimeter of port 312. Valves 322 are used to control the flow of fluids or gases through passageway 316 and vacuum pipe 320. Frame 302 includes a reservoir or pressure vessel 330, a passageway 332 that leads from reservoir 330 to port 312. A vacuum pump 334 is connected to passageway 332 and has vacuum pipes 336 that lead to the surface of frame 302 at points around the perimeter of port 312. Valves 338 are used to control the flow of fluids or gases through passageway 332 and vacuum pipe 336. Vacuum pump 318 can be used to evacuate any fluids or gases that escape from connecting ports 312 during a transfer process.

Gas exchange can be utilized in vacuum and non-vacuum processing environments. Helium or hydrogen can be used because of their high heat conductivity. Gases used as coolants should be maintained at low-pressure levels to minimize their effect on the lithography system in case they leak out from the hoses. Fluid exchange can be effectively used in non-vacuum environments. Water is an effective fluid coolant due to its high specific thermal capacity.

Heat can also be exchanged between stage 300 and frame 302 through a technique referred to as mass exchange. Mass exchange involves placing a relatively low temperature object within stage 300 to act as a heat sink. After the object collects a certain amount of heat, the object is removed and then replaced with another relatively low temperature object. In this way, heat is transferred out of stage 300 along with the removed object.

Heat can also be exchanged between stage 300 and frame 302 through direct contact between heat transfer surfaces on each of stage 300 and frame 302. Examples of heat transfer surfaces 226 can be seen in FIGS. 2 and 3. Surfaces 226 can come into contact when the stage comes into contact with the frame. A stage can have heat transfer surfaces on any of its side, top, or bottom surfaces. In turn, the stage can be moved in any direction so that each of its surfaces that contain heat transfer surfaces can make contact with a mating heat transfer surface on the frame.

A type of material that can facilitate the removal of heat from stage 300 is a phase change material (PCM), such as paraffin wax. PCM can come in a solid form that undergoes a phase change into a liquid form when sufficient heat is applied. PCM can store large amounts of energy as latent heat during phase change from a solid to a liquid. Advantageously, in many applications, large quantities of thermal energy can be stored and released at a relatively constant temperature. This is so even when limited volumes and low operating temperature differences are applicable.

PCM can come in a bound form wherein PCM is supported in a supporting structure. Bound PCM is a composite material wherein PCM is suspended throughout a sponge-like or lattice type support structure. Each bound PCM can be in the size and form of a granule wherein a large quantity of the granules forms a powder that can be useful in heat transfer techniques. Bound PCM is advantageous in at least a couple aspects. First, even though PCM has a large capacity for storing heat, PCM is a relatively poor conductor of heat. Therefore, heat can be transferred more easily to the PCM by spreading out PCM in a sponge-like support structure. Secondly, the sponge-like support structure retains the PCM after it goes through its phase change into liquid form. Therefore, bound PCM avoids the difficulties of leaking PCM. An example of a bound PCM is Rubitherm™ PX.

One way to utilize PCM for heat transfer purposes is in mass transfer. A mass of PCM, for example a block, can be utilized as the mass that will collect and store heat in a stage. The large amount of heat energy that can be stored by a mass of PCM increases the effectiveness of mass exchange for heat transfer purposes.

Other ways to utilize PCM for heat transfer purposes uses PCM in the powder form. PCM powder can be transferred to a stage in various contact manners such that it can collect heat from a stage. For example, the PCM can be transferred while suspended in a gas or liquid then transferred through hoses that connect a stage to a frame. The PCM increases the heat capacity of the transferred gas or fluid. Also, the PCM powder itself can be poured directly into and out of the stage. For example, the PCM powder can be poured into the stage through an opening on a top surface of the stage. After the PCM powder collects and stores a certain amount of heat, the PCM powder can then be drained out of the stage. For example, a port on the bottom of the stage can open so that the PCM powder drains out of the stage. Gravity can be the force that causes the PCM to pour into and out of the stage. Funnels and sloped surfaces within the stage can also be configured in so that such openings can be created of side surfaces of a stage, in addition to the top and bottom surfaces of a stage.

PCM can also be utilized to increase the heat capacity of a heat sink positioned within a stage. Such a heat sink is typically located between the heat sources within a stage and the heat transfer surfaces on the surface of a stage. A heat sink having suspended PCM within can be very effective. For example, PCM can be suspended within a graphite lattice that serves to spread out the PCM so that it can more easily collect heat energy. Alternatively, PCM can be spread out in thin layers within the heat sink. The thin layers of PCM can be positioned to run perpendicular to the heat flow axis. Again, the bound PCM allows the stage to store large amounts of thermal energy without significantly changing the temperature of the stage.

As discussed above, the stage of the present invention can include various electronic and mechanical devices for handling various processing, storing, or controlling functions. For example, on-board electronics within a stage can be provided for data processing, control, power conversion, energy storage, diagnostics, and reticle stage monitoring. Such electronics include computer-processing units, actuators, piezo drives, sensor drives, electrostatic chuck drives, amplifiers, temperature sensors, gap sensors, and radio frequency and optical transceivers. Drivers and amplifiers can be used for controlling the sensors, actuators, and valves (for gas and fluid transfer). Drivers can also drive the actuators for moving the reticle with respect to the stage. Actuators types include but are not limited to fluid, ball-screw, electrostatic, and magnetic actuators. Controllers can control functional aspects such as power consumption, signal processing, gas and fluid use. Computer processing units can be placed within a stage to process signals and monitor sensors on the stage. Sensors can be used for various measurements such as temperature, pressure, and distance. Typically, sensors are on placed on a frame, however the processing and buffer devices on the stage allow sensors to be placed on the stage. Transformer can be used for AC/AC, AC/DC, and/or DC/DC power conversion. The various electronic and mechanical devices can be placed throughout a stage or within electronics compartments within a stage. For example, FIG. 3 shows boxes 228, which represent various types of electrical and mechanical devices stored within electronics compartments 228.

Figure 9:
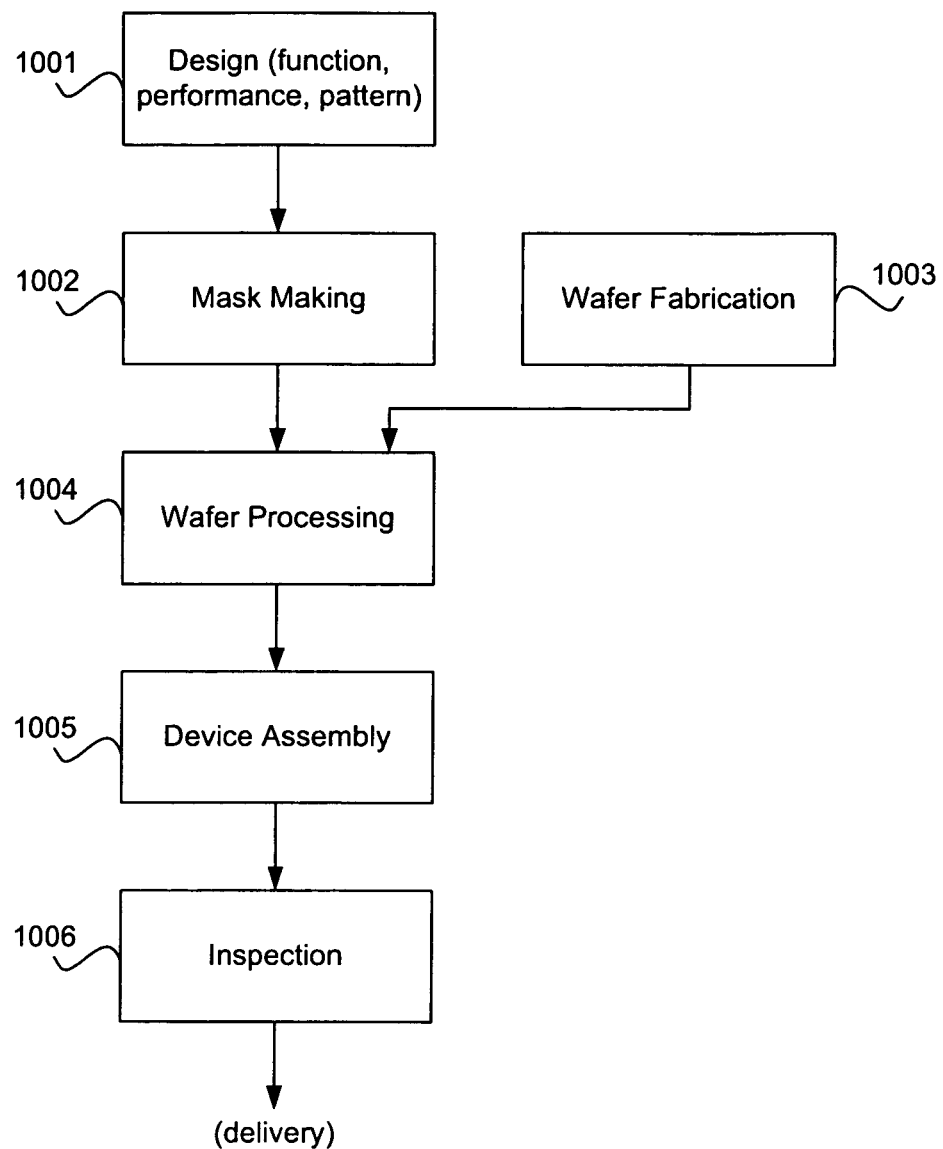
FIG. 9 illustrates an exemplary process for fabricating semiconductor devices using the systems described above.

Semiconductor devices can be fabricated using the above-described systems, by the process shown generally in FIG. 9. In step 1001 the device's function and performance characteristics are designed. Next, in step 1002, a mask (reticle) having a pattern it designed according to the previous designing step, and in a parallel step 1003, a wafer is made from a silicon material. The mask pattern designed in step 1002 is exposed onto the wafer from step 1003 in step 1004 by a photolithography system such as the systems described above. In step 1005 the semiconductor device is assembled (including the dicing process, bonding process and packaging process), then finally the device is inspected in step 1006.

Figure 10:
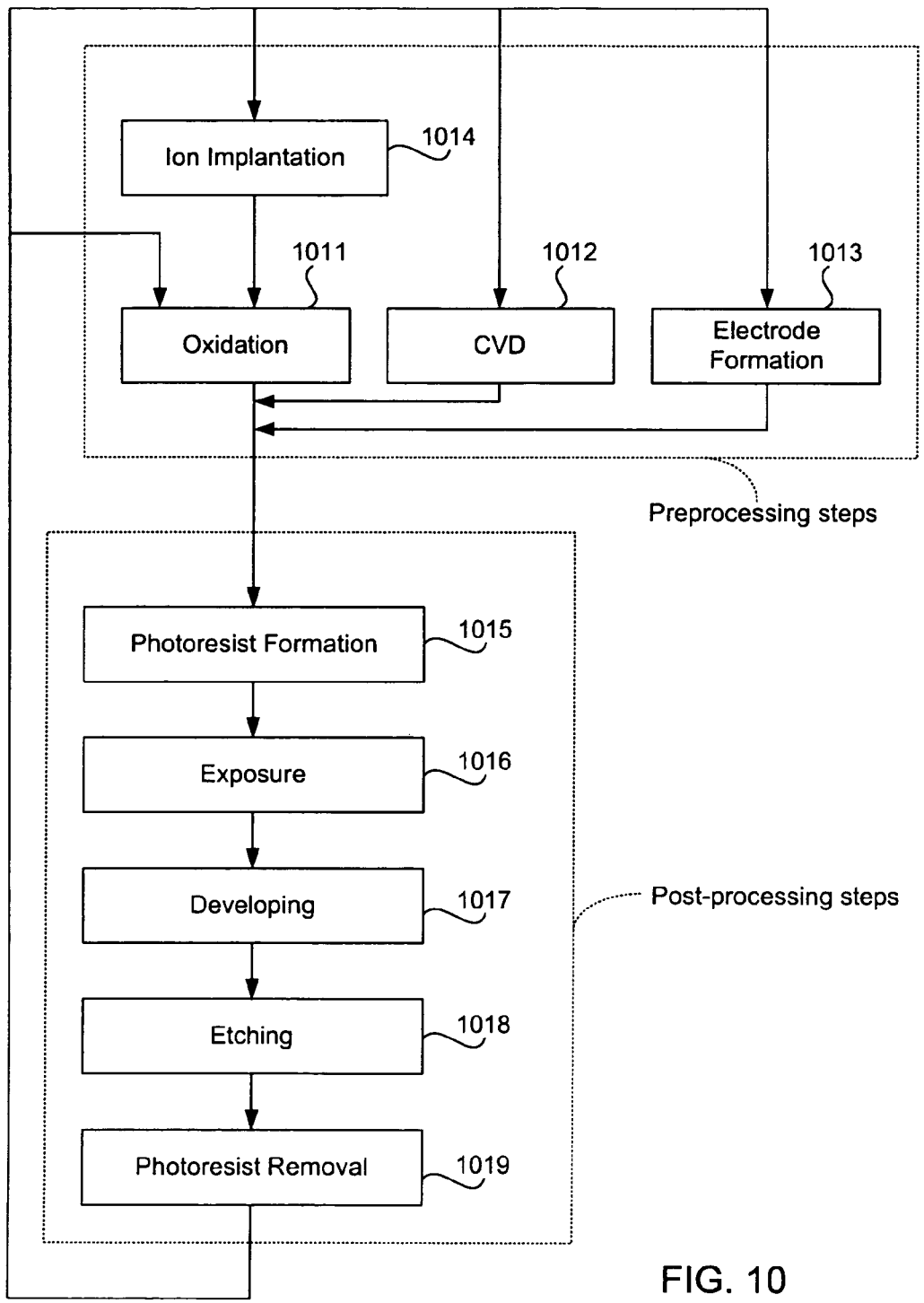
FIG. 10 illustrates a detailed flowchart example of the above-mentioned step 1004 of the process of FIG. 9.

FIG. 10 illustrates a detailed flowchart example of the above-mentioned step 1004 in the case of fabricating semiconductor devices. In step 1011 (oxidation step), the wafer surface is oxidized. In step 1012 (CVD step), an insulation film is formed on the wafer surface. In step 1013 (electrode formation step), electrodes are formed on the wafer by vapor deposition. In step 1014 (ion implantation step), ions are implanted in the wafer. The above mentioned steps 1011-1014 form the preprocessing steps for wafers during wafer processing, and selection is made at each step according to processing requirements.

At each stage of wafer processing, when the above-mentioned preprocessing steps have been completed, the following post-processing steps are implemented. During post-processing, initially, in step 1015 (photoresist formation step), photoresist is applied to a wafer. Next, in step 1016, (exposure step), the above-mentioned exposure device is used to transfer the circuit pattern of a mask (reticle) to a wafer. Then, in step 1017 (developing step), the exposed wafer is developed, and in step 1018 (etching step), parts other than residual photoresist (exposed material surface) are removed by etching. In step 1019 (photoresist removal step), unnecessary photoresist remaining after etching is removed. Multiple circuit patterns are formed by repetition of these preprocessing and post-processing steps.

While this invention has been described in terms of several preferred embodiments, there are alteration, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

We claim:

1. A lithography apparatus comprising:
a lens assembly that projects and/or focuses the light or beam from an illumination system;
a transformer that comprises:
a U-shaped inductive core, the U-shaped core comprising a primary leg disposed along a substantially linear primary axis and a secondary leg disposed along a substantially linear secondary axis,
an inductive primary coil, and
an inductive secondary coil; and
a stage device that supports the secondary coil, the stage device configured to move relative to the primary coil and parallel to the substantially linear secondary axis, wherein the secondary coil surrounds a portion of the outer surface of the secondary leg of the U-shaped inductive core inside a portion of the stage device;
the primary coil surrounding a portion of the outer surface of the primary leg of the inductive core outside of the stage device, wherein the inductive core and the secondary coil are configured to substantially maintain a separation distance from each other during relative movement between the stage and the inductive core;
wherein an electrical current of the primary coil outside of the stage device creates an electromagnetic field that causes an electrical current, via the inductive core, to flow within the secondary coil inside a portion of the stage device.

2. A lithography apparatus as recited in claim 1, wherein the stage device is supported through at least one of air levitation and electromagnetic levitation.

3. A lithography apparatus as recited in claim 1, wherein the stage device includes one of a wafer substrate and a reticle substrate that supports the secondary coil.

4. A lithography apparatus as recited in claim 1, wherein the stage device moves relative to the inductive core along a scanning axis that is substantially parallel to at least a portion of the inductive core.

5. A lithography apparatus as recited in claim 1, wherein the stage device houses two or more secondary coils and wherein each of the secondary coils surrounds at least a portion of the inductive core.

6. A lithography apparatus as recited in claim 1 further comprising:
at least one of a stage radio frequency transmitter, a receiver, a transceiver and a battery that is positioned within the stage device and provided with electrical current from the secondary coil.

\* \* \* \* \*